US010126652B2

(12) United States Patent
Black et al.

(10) Patent No.: US 10,126,652 B2
(45) Date of Patent: Nov. 13, 2018

(54) LITHOGRAPHIC PATTERNING

(71) Applicant: Brookhaven Science Associates, LLC, Upton, NY (US)

(72) Inventors: Charles Thomas Black, New York, NY (US); Aaron Stein, Huntington Station, NY (US); Gwen Wright, Medford, NY (US); Kevin G. Yager, East Setauket, NY (US)

(73) Assignee: Brookhaven Science Associates, LLC, Upton, NY (US)

( * ) Notice: Subject to any disclaimer, the term of this patent is extended or adjusted under 35 U.S.C. 154(b) by 12 days.

(21) Appl. No.: 15/269,202

(22) Filed: Sep. 19, 2016

(65) Prior Publication Data

US 2017/0108778 A1   Apr. 20, 2017

Related U.S. Application Data

(60) Provisional application No. 62/220,610, filed on Sep. 18, 2015.

(51) Int. Cl.
| | |
|---|---|
| G03F 7/20 | (2006.01) |
| G03F 7/40 | (2006.01) |
| G03F 7/039 | (2006.01) |
| G03F 7/038 | (2006.01) |
| G03F 7/16 | (2006.01) |
| G03F 7/32 | (2006.01) |

(52) U.S. Cl.
CPC ............ *G03F 7/2037* (2013.01); *G03F 7/038* (2013.01); *G03F 7/039* (2013.01); *G03F 7/162* (2013.01); *G03F 7/168* (2013.01); *G03F 7/325* (2013.01); *G03F 7/40* (2013.01)

(58) Field of Classification Search
CPC ........ G03F 7/2037; G03F 7/038; G03F 7/039; G03F 7/162; G03F 7/168; G03F 7/325; G03F 7/40
USPC .......................... 430/296, 314, 323, 942, 945
See application file for complete search history.

(56) References Cited

U.S. PATENT DOCUMENTS 9,129,812 B2 * 9/2015 Gao ................... H01L 21/0337

OTHER PUBLICATIONS

Abetz, V. et al.—Formation of superlattices via blending of block copolymers. Macromol. Rapid Commun. 21, 16-34 (2000).
Almdal, K. et al.—Gaussian- to stretched-coil transition in block copolymer melts. Physical Review Letters, 65, 1112-1115 (1990).
Antonietti, M. et al.—Determination of the Micelle Architecture of Polystyrene/Poly(4-vinylpyridine) Block Copolymers in Dilute Solution. Macromolecules, 27, 3276-3281 (1994).
Berry, B. C. et al.—Orientational order in block copolymer films zone annealed below the order-disorder transition temperature. Nano Lett. 7, 2789-2794 (2007).
Bita, I. et al.—Graphoepitaxy of self-assembled block copolymers on two-dimensional periodic patterned templates. Science 321, 939-943 (2008).
Bosworth, J. K. et al.—Selective area control of self-assembled pattern architecture using a lithographically patternable block copolymer. ACS Nano 3, 1761-1766 (2009).
Chang, J.-B. et al.—Design rules for self-assembled block copolymer patterns using tiled templates. Nat. Commun. 5, 3305 (2014).
Cheng, J. Y. et al.—Templated self-assembly of block copolymers: top-down helps bottom-up. Adv. Mater. 18, 2505-2521 (2006).
Doerk, G. S. et al.—Enabling complex nanoscale pattern customization using directed self-assembly. Nat. Commun. 5, 5805 (2014).
Edwards, E W. et al.—Dimensions and shapes of block copolymer domains assembled on lithographically defined chemically patterned substrates. Macromolecules 40, 90-96 (2007).
Edwards, E W. et al.—Long-range order and orientation of cylinder-forming block copolymers on chemically nonpatterned striped surfaces. Macromolecules 39, 3598-3607 (2006).
Hadziioannou, G. et al.—Structural study of mixtures of styrene isoprene two- and three-block copolymers. Macromolecules 15, 267-271 (1982).
Harrison, C. et al.—Dynamics of pattern coarsening in a two-dimensional smectic system. Phys. Rev. E 66, 011706 (2002).
Hashimoto, T. et al.—Ordered structure in blends of block copolymers. 2. Self-assembly for immiscible lamella-forming copolymers. Macromolecules 27, 1562-1570 (1994).
Hsu, H.-P. et al.—Polymers confined between two parallel plane walls. J. Chem. Phys 120, 2034-2041 (2004).
Knoll, A. et al.—Phase behavior in thin films of cylinder-forming block copolymers. Phys. Rev. Lett. 89, 035501 (2002).
Koizumi, S. et al.—Ordered structure in blends of block copolymers. 3. Self-assembly in blends of sphere- or cylinder-forming copolymers. Macromolecules 27, 4371-4381 (1994).
Koo, K. et al.—Directed self-assembly of block copolymers in the extreme: guiding microdomains from the small to the large. Soft Matter 9, 9059-9071 (2013).
Majewski, P. W. et al.—Millisecond ordering of block copolymer films via photothermal gradients. ACS Nano 9, 38963906 (2015).
Matsen, M. W.—Immiscibility of large and small symmetric diblock copolymers. J. Chem. Phys. 103, 3268-3271 (1995).
Matsen, M.W. et al.—One-component approximation for binary diblock copolymer blends. Macromolecules 28, 72987300 (1995).
Ruiz, R. et al.—Density multiplication and improved lithography by directed block copolymer assembly. Science 321, 936-939 (2008).
Segalman, R. A. et al.—Effects of lateral confinement on order in spherical domain block copolymer thin films. Macromolecules 36, 6831-6839 (2003).
Son, J. G. et al.—Assembly of sub-10-nm block copolymer patterns with mixed morphology and period using electron Irradiation and solvent annealing. Nano Lett 11, 5079-5084 (2011).
Stein, A. et al.—Selective directed self-assembly of coexisting morphologies using block copolymer blends. Nat. Commun. 7:12366 DOI: 10.1038/ncomms12366 and Supplementary materials (2016).

(Continued)

Primary Examiner — Christopher G Young
(74) Attorney, Agent, or Firm — Dorene M. Price

(57) ABSTRACT

This disclosure provides embodiments of an approach that enforces coexistence of multiple, aligned block copolymer morphologies within a single patterning layer.

17 Claims, 6 Drawing Sheets

(56) References Cited

OTHER PUBLICATIONS

Stein, G. E. et al.—Controlling interfacial interactions for directed self assembly of block copolymers. J. Polym. Sci. B Polym. Phys. 53, 96-102 (2014).
Stoykovich, M. P. et al.—Directed self-assembly of block copolymers for nanolithography: fabrication of isolated features and essential integrated circuit geometries. ACS Nano 1, 168-175 (2007).
Sundrani, D. et al.—Guiding polymers to perfection: macroscopic alignment of nanoscale domains. Nano Lett. 4, 273-276 (2004).
Tavakkoli, K. G. A. et al.—Sacrificial-post templating method for block copolymer self-assembly. Small 10, 493-499 (2013).
Tavakkoli, K. G. A. et al.—Templating three-dimensional self-assembled structures in bilayer block copolymer films. Science 336, 1294-1298 (2012).
Yager, K. G. et al.—Evolution of block-copolymer order through a moving thermal zone. Soft Matter 6, 92-99 (2010).
Yager, K. G. et al.—Self-assembled phases of block copolymer blend thin films. ACS Nano 8, 10582-10588 (2014).
Yang, J. K. W. et al.—Complex self-assembled patterns using sparse commensurate templates with locally varying motifs. Nat Nanotechnol. 5, 256-260 (2010).
Zhao, J. et al.—Phase behavior of pure diblocks and binary diblock blends of poly(ethylene)-poly(ethylethylene). Macromolecules 29, 1204-1215 (1996).

* cited by examiner

LITHOGRAPHIC PATTERNING

CROSS-REFERENCE TO A RELATED APPLICATION

This application claims the benefit under 35 U.S.C. 119(e) of U.S. Provisional Application No. 62/220,610 filed on Sep. 18, 2015, the disclosure of which is incorporated herein in its entirety.

STATEMENT OF GOVERNMENT RIGHTS

This invention was made with Government support under contract number DE-AC02-98CH10886 and DE-SC0012704 awarded by the U.S. Department of Energy. The Government has certain rights in the invention.

FIELD OF THE INVENTION

This disclosure relates generally to the fabrication of nanometer-scale structures. In particular, it relates to lithographically creating nanometer-scaled patterns on surfaces.

BACKGROUND

Directed self-assembly (DSA) is an emergent nano-lithography approach in which self-assembling block copolymer thin films (BCP) are ordered using larger-scale, predefined guides patterned by standard lithography. Typically, lamellar (line/space) or cylindrical (arrays of dots) copolymer pattern morphologies are spatially templated by either topographic relief or patterned chemical inhomogeneity on the substrate. Commensurability between the guiding feature spacing and the natural pitch of the copolymer induces a high degree of position and orientation order in the self-assembled, nanoscale patterns. However, directed self-assembly is limited in the range of structures that can be fabricated in a single layer because each BCP material defines only a single equilibrium morphology.

These approaches still rely on a single morphology to generate patterns, controlling the type of pattern formed by the orientation of the morphology relative to the surface. For example, a cylinder oriented surface-perpendicular produces a circular hole, while the same cylinder oriented surface parallel produces a line. Defining the pattern by orientation control is not ideal for fabrication, most notably during subsequent pattern transfer processes, as the perpendicular and parallel orientations require different considerations during these steps.

SUMMARY

This disclosure provides embodiments of a new approach that enforces coexistence of multiple, aligned block copolymer morphologies within a single patterning layer.

In an embodiment, a method is provided which includes plasma cleaning a substrate, depositing a polymer brush onto a surface of the substrate, depositing a resist layer, optionally annealing the resist layer, forming grating patterns onto the resists, developing the grating patterns, etching to transfer the grating pattern to the polymer brush, depositing block copolymer films onto to the substrate. The resulting film may be annealed.

DESCRIPTION

This disclosure relates to the challenge of lithographically creating patterns on surfaces with dimensions in the range of 5-50 nanometers. This size range is challenging for the traditional optical lithography equipment used in semiconductor electronics industry and other high technology industries. More specialized equipment such as electron beam lithography has the required resolution but lacks the speed (throughput) necessary for manufacturing. The semiconductor industry has turned to nanotechnology "self-assembly" based methods as a possible alternative, and is taking a particularly long/hard look at self-assembly of block copolymer thin films (BCP) as a potential solution. Block copolymer self-assembly has perhaps the right combination of resolution and speed to be manufacturable. However, many challenges remain unsolved before technology adoption. One particular issue is that block copolymer self-assembly creates a single pattern type within a layer—very different from the arbitrary patterns that can be created using lithography tools.

Figure 2:
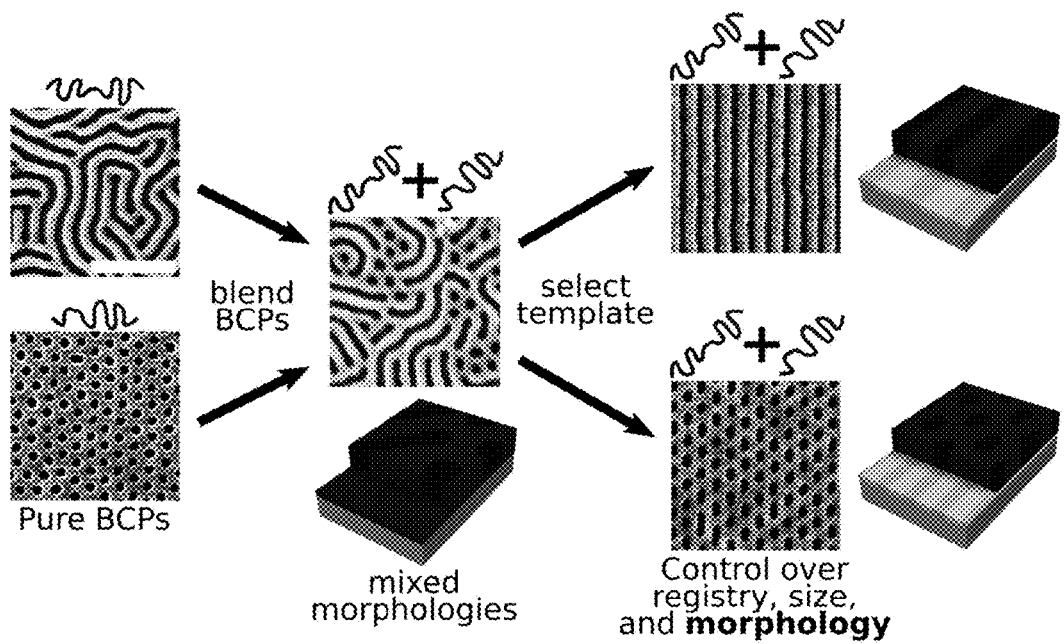
FIG. 2 depicts embodiments of selective directed self-assembly, in which the substrate prepattern also selects the local morphology formed by a block copolymer blend (either cylindrical or lamellar), in addition to imparting long-range order. White scale bar in scanning electron microscope images denotes 250 nm.
Figure 3A:
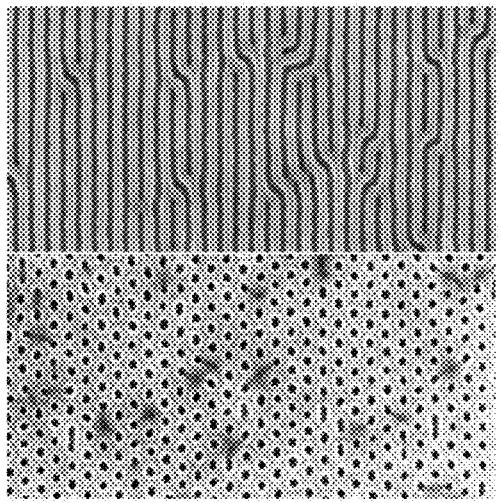
FIG. 3A depicts scanning electron microscope images of lamella (top picture) and cylinder (bottom picture) forming block copolymers self-assembled on chemical line grating patterns with 44 nm pitch, according to embodiments of the invention.
Figure 3B:
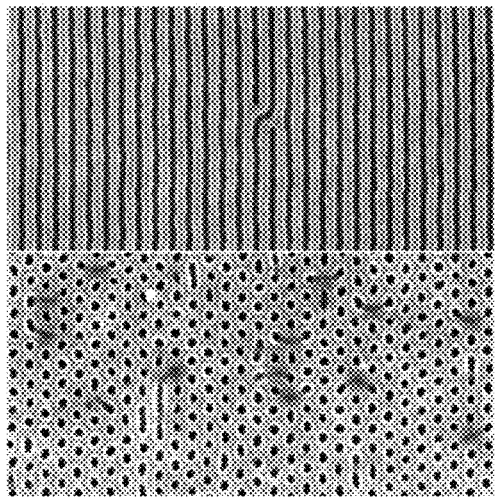
FIG. 3B depicts scanning electron microscope images of lamella (top picture) and cylinder (bottom picture) forming block copolymers self-assembled on chemical line grating patterns with 47 nm pitch, according to embodiments of the invention.
Figure 3C:
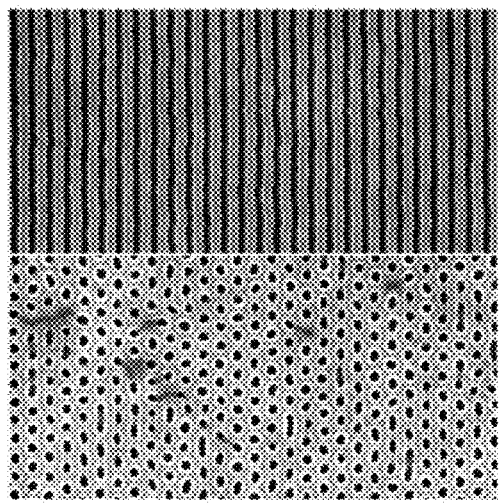
FIG. 3C depicts scanning electron microscope images of lamella (top picture) and cylinder (bottom picture) forming block copolymers self-assembled on chemical line grating patterns with 49 nm pitch, according to embodiments of the invention.
Figure 3D:
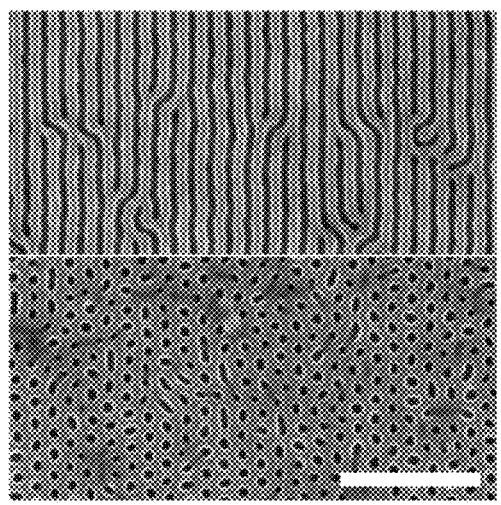
FIG. 3D depicts scanning electron microscope images of lamella (top picture) and cylinder (bottom picture) forming block copolymers self-assembled on chemical line grating patterns with 52 nm pitch, according to embodiments of the invention. The white scale bar denotes 400 nm.

This disclosure provides a new approach that enforces coexistence of multiple, aligned block copolymer morphologies within a single patterning layer (FIG. 2). This approach is described by Stein et al. in *Nature Communications* 7:12366, DOI: 10.1038/ncomms12366, the disclosure of which (including the supplemental information) is incorporated herein in its entirety. This extension to directed self-assembly involves furthering the role of the template guiding pattern in influencing the block copolymer assembly process. In addition to enforcing positional order, here the template may locally select the desired motif of a block copolymer resist capable of forming multiple patterning morphologies.

Figure 1:
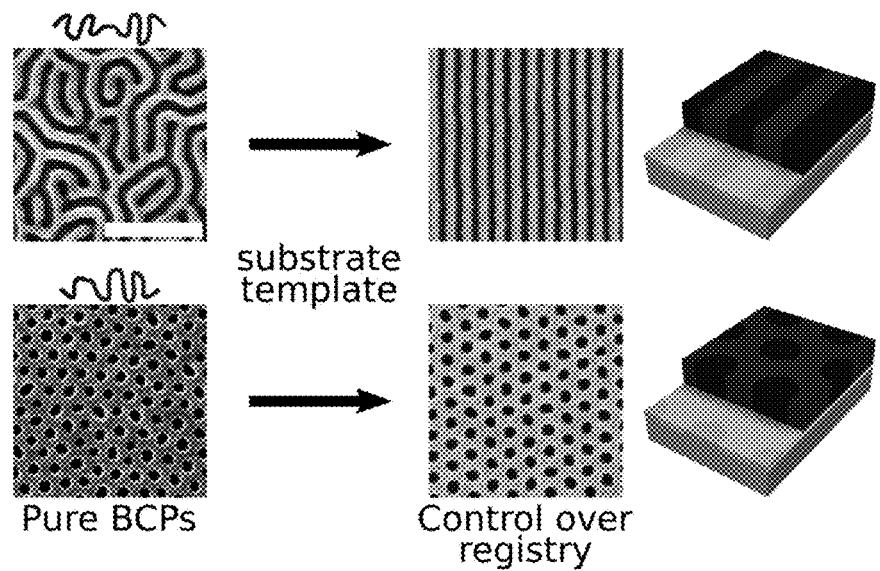
FIG. 1 depicts prior art directed self-assembly, which utilizes a substrate prepattern to impart long-range order to both lamellar and cylindrical self-assembled block copolymer films.

In an example, self-assembly of a blended 50/50 mixture of polystyrene (PS) and poly(methyl methacrylate) (PMMA) (PS-b-PMMA) lamellar and cylindrical phase block copolymers onto any appropriate surface chemical patterns results in simultaneous formation of coexisting ordered morphologies in separate areas of a substrate (cylinders and lamella). This is in contrast to more typical directed self-assembly shown in FIG. 1, wherein assembly of either lamella-forming or cylinder-forming PS-b-PMMA block copolymers onto chemical patterns generates well-ordered patterns of either lines/spaces (lamellae) or hexagonal dot arrays (cylinders). The spacing (pitch) and duty cycle of the underlying chemical pattern influences the quality of the block copolymer assembly but not the morphology. Here the chemical template selects and encodes desired local spatial arrangements of different coexisting morphologies, self-assembled from a single, sophisticated resist—a block copolymer blend capable of simultaneously forming multiple design motifs.

Substrate chemical prepatterns may be formed by electron-beam exposure of silicon wafers treated with a PS brush. Exposure and chemical development of a PMMA electron-beam resist (about 50 nm thick) may result in line/space grating patterns with spacing (pitch) ranging from about 40 to about 60 nm. A subsequent oxygen etch may transfer the image into the underlying PS brush, creating chemical contrast between it and the native (hydrophillic) $SiO_2$ substrate.

The chemical grating prepatterns may impart a high degree of translational order to the assembly of a thin film made from, for example, a 1:1 blend of lamellar and cylindrical PS:PMMA block copolymers. The BCP morphologies align and register to the prepattern because the PMMA block lowers its energy by segregating to the $SiO_2$ stripes, while the PS block tends to wet the PS substrate regions. In addition, the material self assembles into well-ordered hexagonal cylinder patterns for some prepattern pitches (e.g., 42 nm) and aligned line/space patterns for others (e.g., 50 nm). The two BCP materials in the blend may remain intimately mixed on the chemical templates, and it is the underlying chemical template that may determine which type of pattern (lines/spaces, or dot arrays) is formed by the blend. Casting this same blend onto a neutral surface may result in a two-dimensional mixed morphology (lines and dots), without evidence of vertical segregation of constituent chains, or more complex three-dimensional structure.

The directed pattern morphology may be entirely lines/space for grating prepattern pitches between about 48 nm and about 54 nm, and may transition sharply to a majority hexagonal dot array for pitches <44 nm. Chemical patterns with pitch larger than ~55 nm may in some examples result in poorly aligned patterns with mixed morphology. Thus, the morphology that develops can be selected based on the pitch of the underlying chemical pattern. Chemical prepatterns with similar pitches but different duty cycles can also change the type of pattern formed by the blend from lines to dots.

One may locally encode the pattern motif of a cylinder/lamellae block copolymer blend resist using either the pitch and/or duty cycle of the underlying chemical prepattern, imparting an important new function to the lithographically defined chemical prepattern beyond guiding the positional assembly of nanoscale domains. Through careful design, this approach may be used to generate more arbitrary, localized morphologies within a single self-assembled copolymer blend layer. For example, grating prepatterns with identical pitches alternating between regions 50 nm and 46 nm can be programmed to assemble either alternating dot array/line array regions or the inverse (line array/dot array) by independently changing the duty cycles within the two regions of the pre pattern. By locally varying the pitch of the chemical prepattern, it may be possible to similarly program regions of hex dots and lines ranging from multiple periods of each to a single period. For example, the regions where the prepattern has a larger pitch form a line morphology, with a correspondingly larger pitch; whereas regions with a tight prepattern pitch form a dot morphology with a small pitch. In the limit of directing the assembly of alternating single columns of lines and dots from a blend, we rely on the material's sensitivity to both prepattern pitch and duty cycle to program the location of each. More complex, non-uniform areas of dots and lines can be programmed through suitable prepattern design.

Although polystyrene (PS) and poly(methyl methacrylate) (PMMA) blends are described above, any suitable mixture of block copolymers may used for patterning, including, but not limited to PS-PMMA, PS-P2VP (styrene-b-2-vinylpyridine), PS-P4VP (polystyrene-b-4-vinylpyridine), PS-PEO (styrene-b-polyethylene oxide), and PS-PDMS (styrene-b-polydimethylsiloxane).

The range of copolymer molecular weights used in patterning may range approximately from about 5 kg/mol to about 500 kg/mol.

Although in the embodiment above, equal volumes of two block copolymer materials are blended, the ratio can be varied. Furthermore, more than 2 copolymers may be mixed into the blend.

Although in the embodiment above, a cylindrical phase material with a lamellar phase material is mixed, other possible phases that can be mixed include, but is not limited to, spherical and gyroid phases. Furthermore, two materials of the same phase, but different molecular weights can be mixed.

Although in the embodiment above, electron beam lithography is used to define the chemical prepattern, any type of lithography can be used, including photolithography, ion beam lithography, laser lithography, interference lithography, and imprint lithography.

The chemical prepatterns may be integer multiples of the intrinsic block copolymer length scale, rather than approximately equal to that length scale as shown in the embodiment above.

Although in the embodiment above, chemical prepattern is made using hydrophobic (PS)/hydrophillic (silicon oxide) stripes, other materials can be used, and the prepattern may be shapes other than stripes.

These same principles of the embodiments described herein may also be applied to prepatterns defined using graphoepitaxy.

EXAMPLES

Assembly of Single Morphology BCP on Grating Prepatterns.

Electron beam lithography and O2 plasma etching was used to generate chemically patterned substrates of alternating hydrophobic, polystyrene (PS) and hydrophilic (nominally SiO2) stripes, which imparts a high degree of translational order to the assembly of the individual lamellar polystyrene-block-poly(methyl methacrylate) (PS-b-PMMA) (MW=104 kg mol$^{-1}$, PS:PMMA 50:50) (FIGS. 3A-3D, top row) and cylindrical (MW=99 kg mol$^{-1}$, PS:PMMA 54:46) (FIGS. 3A-3D, bottom row) BCP phases.

Figure 4A:
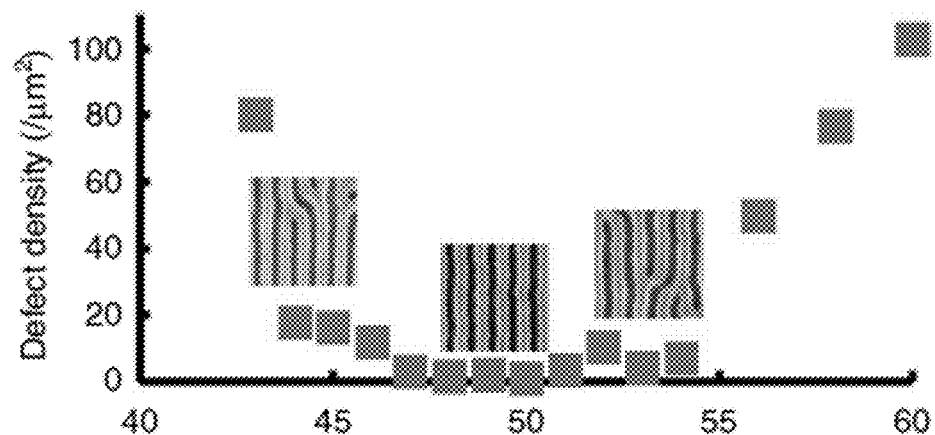
FIG. 4A is a graph showing the defect density versus chemical pattern pitch for lamellar phase block copolymer films with representative scanning electron microscope images.
Figure 4B:
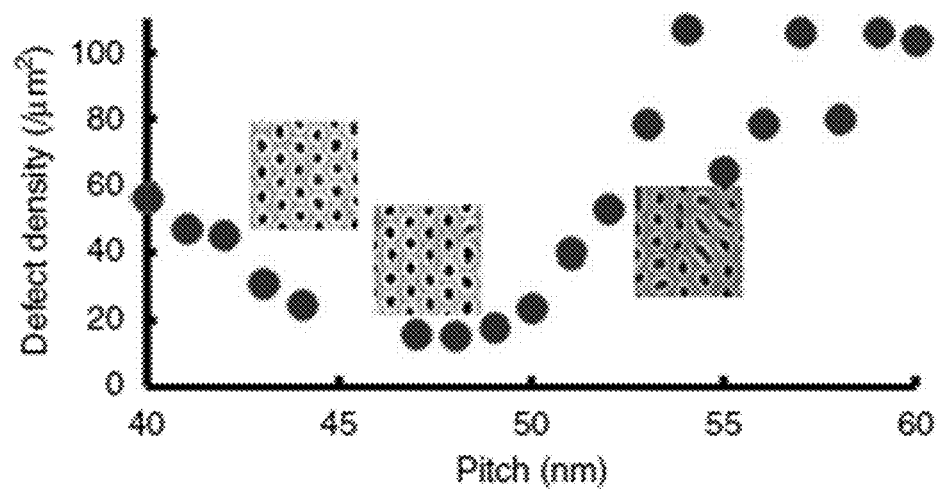
FIG. 4B is a graph showing the defect density versus chemical pattern pitch for cylindrical phase block copolymer films with representative scanning electron microscope images.

Multiple copies of each grating prepattern is fabricated, systematically increasing the electron beam exposure dose between copies to widen the linewidth of the hydrophilic oxide stripe while keeping the spacing constant. While it may be challenging to measure the absolute chemical pattern linewidths; the exposure dose provides a robust means of systematically varying this width. The BCP morphologies align and register to the prepattern because the PMMA block lowers its energy by segregating to the SiO$_2$ stripes, while the PS block wets PS substrate regions. The quality of the self-assembled pattern may be quantified by calculating defect density at each pitch, using image analysis (FIGS. 4A and 4B)). The lamellar BCP remains highly ordered with almost zero defects across a range of chemical prepattern pitches, centred on the intrinsic BCP repeat period (L$_0$=48 nm) (FIG. 3A) as one would expect for line-forming patterns on a line grating. The cylindrical morphology also aligns well with low defectivity, tolerating substantial mismatch between its intrinsic repeat period (for a cylindrical morphology, this is the distance between cylinder rows, L$_0$=44 nm) and the prepattern pitch (FIG. 4B). The lamellar and cylinder systems exhibit some qualitative differences in their response to pattern mismatch (for example, sharpness of the transition from ordered to disordered patterns). This differential tolerance may be exploited to locally select the pattern motif of a blended lamellar/cylindrical BCP resist.

Assembly of BCP Blend on Grating Prepatterns.

Figure 5A:
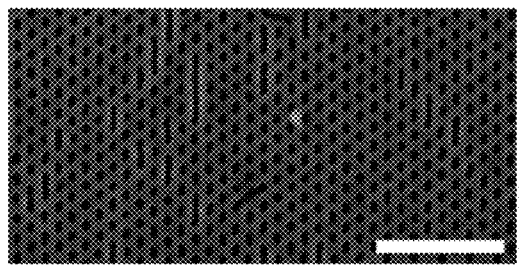
FIG. 5A depicts a scanning electron microscope image of a 1:1 lamella:cylinder blend self-assembled on chemical line grating patterns with 42 nm pitch, using an electron beam exposure dose of $D=1.1\ D_0$ (where $D_0=1,600\ \mu C\ cm^{-2}$) to define the chemical pattern, according to an embodiment of the invention. The white scale bar denotes 400 nm.
Figure 5B:
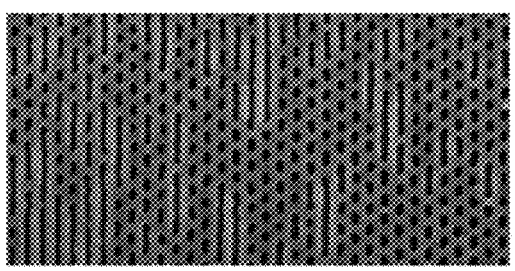
FIG. 5B depicts a scanning electron microscope image of a 1:1 lamella:cylinder blend self-assembled on chemical line grating patterns with 46 nm pitch, using an electron beam exposure dose of $D=1.1\ D_0$ (where $D_0=1,600\ \mu C\ cm^{-2}$) to define the chemical pattern, according to an embodiment of the invention.
Figure 5C:
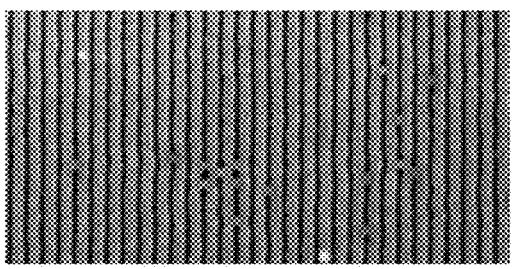
FIG. 5C depicts a scanning electron microscope image of a 1:1 lamella:cylinder blend self-assembled on chemical line grating patterns with 50 nm pitch, using an electron beam exposure dose of $D=1.1\ D_0$ (where $D_0=1,600\ \mu C\ cm^{-2}$) to define the chemical pattern, according to an embodiment of the invention.
Figure 5D:
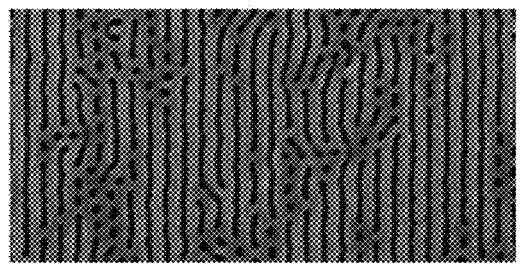
FIG. 5D depicts a scanning electron microscope image of a 1:1 lamella:cylinder blend self-assembled on chemical line grating patterns with 54 nm pitch, using an electron beam exposure dose of $D=1.1\ D_0$ (where $D_0=1,600\ \mu C\ cm^{-2}$) to define the chemical pattern, according to an embodiment of the invention.

A thin film made from a 1:1 blend of the same lamellar and cylindrical block copolymers assembles differently on the same type of underlying line/space chemical prepatterns (FIGS. 5A-5D), forming well-ordered hexagonal cylinder patterns for some prepattern pitches (for example, 42 nm, FIG. 5A) and line/space patterns for others (for example, 50 nm, FIG. 5C). The BCP blend has an L$_0$ of 46 nm when formed on a substrate with a random PS/PMMA polymer brush. In these experiments macrophase separation of the blend components is not observed. Rather, the two BCP materials remain intimately mixed, as evidenced by the uniform patterns across the macroscopic sample dimensions (FIGS. 5A-5D). Cross-sectional SEM images show the films to be two-dimensional with a thickness of 27 nm, without evidence of vertical segregation of constituent chains, or a more complex three-dimensional structure.

Figure 6A:
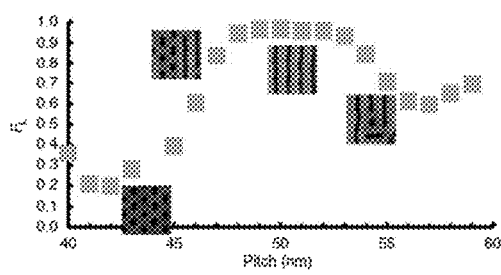
FIG. 6A is a graph showing the fractional pattern area covered by lines $F_L$, versus pitch of the underlying chemical prepattern for a single electron-beam dose $D=1.1\ D_0$. $F_L=1$ denotes an entire pattern of lines, $F_L=0$ denotes an entire pattern of dots. Representative scanning electron microscope images are inserted.

The fractional pattern area covered by lines (F$_L$) may be quantified by analysis of the SEM images, where F$_L$=0 denotes a complete hexagonal dot pattern and F$_L$=1 corresponds to entirely lines/spaces. In FIGS. 5A-5D, the directed pattern morphology is entirely lines/space (F$_L$~1) for grating prepattern pitches between 48 and 54 nm, and transitions sharply to a majority hexagonal dot array (F$_L$~0.2) for pitches <44 nm (FIG. 6A). Although the prepattern pitch is precisely controlled, there is greater uncertainty with respect to the oxide stripe width. This stripe width likely decreases slightly for large prepattern pitches due to the nature of the fabrication process. Chemical patterns with pitch larger than B55 nm result in poorly aligned patterns with mixed morphology ($F_L$~0.6). Thus, the displayed pattern morphology can be selected based on the pitch of the underlying chemical pattern.

Figure 6B:
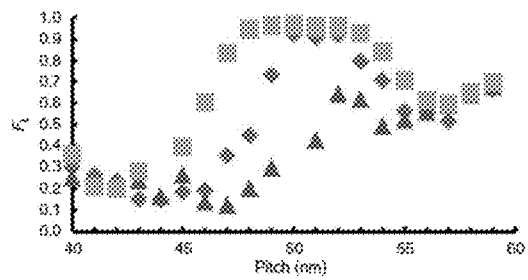
FIG. 6B is a graph showing the fractional pattern area covered by lines $F_L$ versus chemical prepattern pitch for different electron-beam prepattern doses, 1.1 $D_0$ (squares), 1.2 $D_0$ (diamonds), and 1.3 $D_0$ (triangles) (where $D_0$=1,600 µC cm$^{-2}$).
Figure 6C:
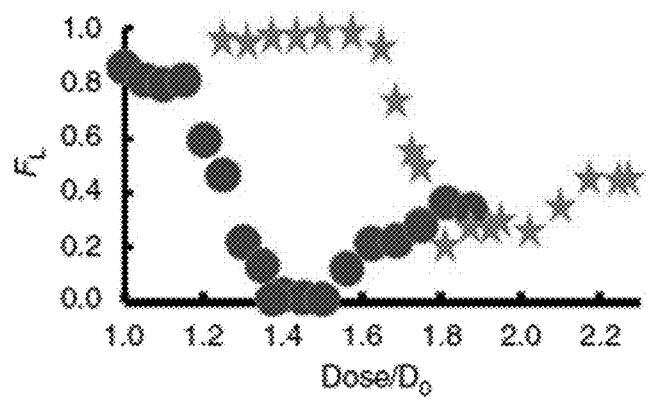
FIG. 6C is a graph showing $F_L$ versus dose for prepattern pitch of 46 nm (circles) and 50 nm (stars).
Figure 7A:
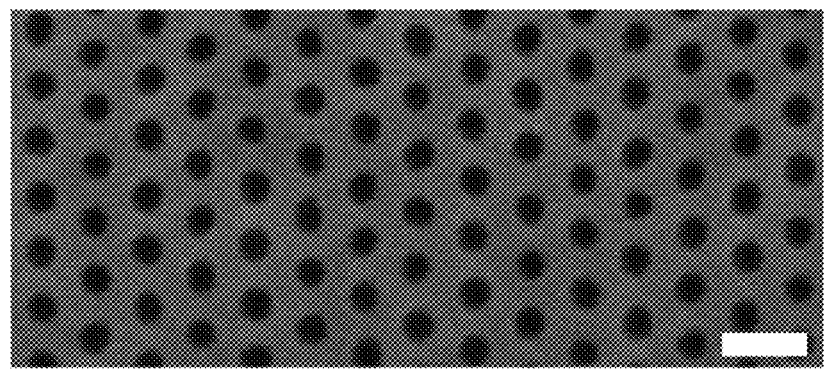
FIG. 7A is a scanning electron microscope image depicting regions of fully ordered, nearly defect-free hexagonal dot arrays with $F_L$~0 within a single BCP blend on the same substrate, according to an embodiment of the invention.
Figure 7B:
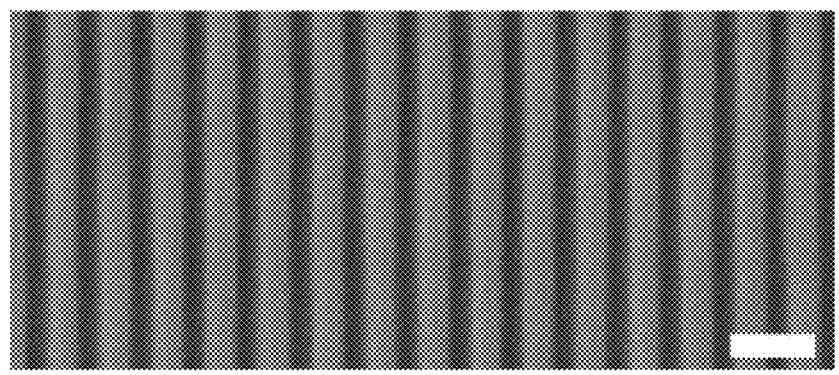
FIG. 7B is a scanning electron microscope image depicting regions of fully ordered, nearly defect-free line gratings with $F_L$~1 within a single BCP blend on the same substrate, according to an embodiment of the invention.

Chemical prepatterns with the same set of pitches but fabricated using higher electron beam exposure create systematically wider $SiO_2$ linewidths and wider hydrophilic regions (see diamonds and triangles FIG. 6B) and can change the type of pattern formed by the blend from lines to dots, as evidenced at the prepattern pitch of 48 nm, where the blend changes from forming nearly uniform lines/spaces ($F_L$~1, squares in FIG. 6B) to hexagonal dots ($F_L$~0.2, triangles in FIG. 6B) as the oxide stripe widens. The process may be optimized by selecting single grating pitch parameters preferential for either line or dot patterns and varying the exposure dose to control the SiO2 linewidth. FIG. 6C shows the line fraction for a 46 nm prepattern pitch (circles) and 50 nm prepattern pitch (stars). The parameters of pitch and oxide linewidth can be independently selected, making it possible to program regions of fully ordered, nearly defect-free hexagonal dot arrays with $F_L$~0 (FIG. 7A) and line gratings $F_L$~1 (FIG. 7B) within a single BCP blend on the same substrate.

Blends of block copolymers can form either homogeneous single phases, or coexisting phases. It has also been demonstrated that in thin films, blends of BCP cylinders and lamellae can either form a single-phase or two-phase morphologies. Coexistence is a signature of the energy-degeneracy of two possible morphologies. In the present work, this phenomena is exploited, using a blend composition (1:1) designed to give coexistence of dots and lines on unpatterned, neutral substrates (FIG. 2). Nevertheless, the ability to locally select the morphology through the underlying template pitch is surprising because one might naively expect lamellar morphologies to always be favoured (compared with hexagonal dot arrays) on chemical line/space patterns, given their symmetry match to the guiding pattern. Instead, we observe that certain ranges of template pitch and linewidths drive the blend to adopt a pattern of hexagonally registered dots.

Increasing Complexity of Self-Assembled BCP Blend.

Figure 8A:
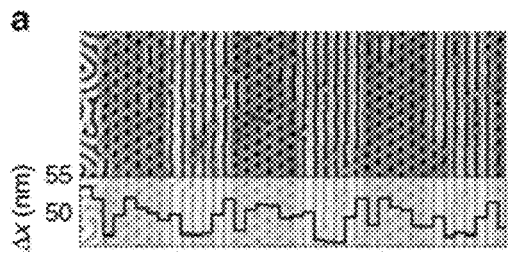
FIG. 8A is a scanning electron microscope image depicting selective directed self-assembly of simultaneous coexisting morphologies, according to an embodiment of the invention. The image has an overlay of the local morphology spacing ($\Delta$x, line), across the grating pitch (computed using image analysis).
Figure 8B:
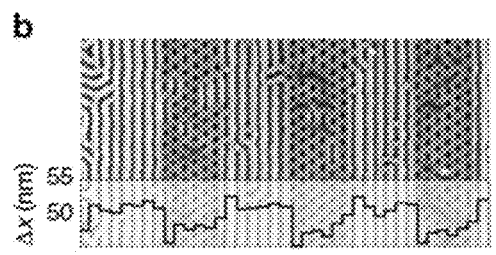
FIG. 8B is a scanning electron microscope image depicting selective directed self-assembly of simultaneous coexisting morphologies, according to an embodiment of the invention. The image has an overlay of the local morphology spacing ($\Delta$x, line), across the grating pitch (computed using image analysis). The chemical patterns used in FIG. 8A and FIG. 8B have identical alternating regions of pitch=50 and 46 nm.
Figure 8C:
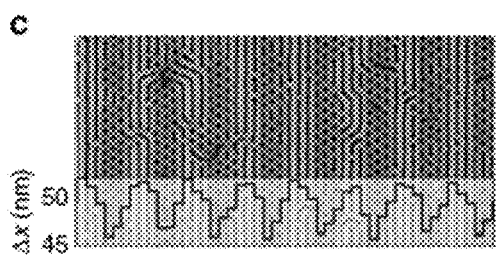
FIG. 8C is a scanning electron microscope image depicting selective directed self-assembly of simultaneous coexisting morphologies, according to an embodiment of the invention. The image has an overlay of the local morphology spacing ($\Delta$x, line), across the grating pitch (computed using image analysis).
Figure 8D:
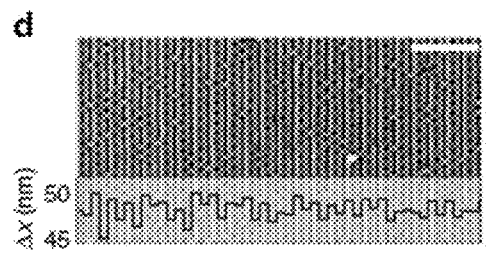
FIG. 8D is a scanning electron microscope image depicting selective directed self-assembly of alternating morphologies down to single columns of lines and dots in close proximity, according to an embodiment of the invention. The image has an overlay of the local morphology spacing ($\Delta$x, line), across the grating pitch (computed using image analysis).
Figure 8E:
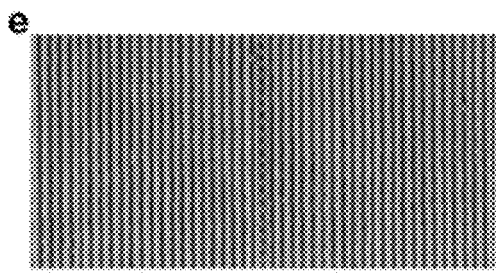
FIG. 8E is a scanning electron microscope image depicting selective directed self-assembly of a single column of dots in a field of lines, according to an embodiment of the invention.
Figure 8F:
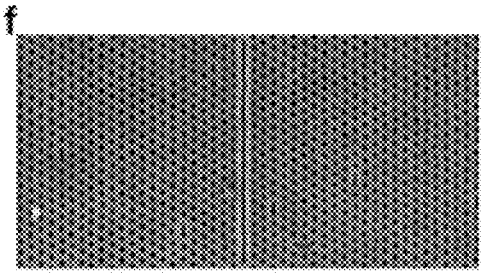
FIG. 8F is a scanning electron microscope image depicting selective directed self-assembly of a single line in a field of well-ordered dots, according to an embodiment of the invention.

The results above imply that one may locally encode the pattern motif of a cylinder/lamellae BCP blend resist using pitch and/or oxide stripe width of the underlying chemical prepattern. Through careful design, this approach may be used to generate arbitrary, localized morphologies within a single self-assembled copolymer blend layer. For example, grating prepatterns with pitch alternating between regions 50 and 46 nm can be programmed to assemble either alternating dot array/line array regions (FIG. 8A) or the inverse (FIG. 8B) by independently changing the widths of the oxide stripes within the two regions of the prepattern. By locally varying the pitch of the chemical prepattern, one can similarly program regions of hex dots and lines ranging from multiple periods of each to a single period. This is emphasized in FIG. 8 by the overlaid traces, which are measurements of the local spacing of the BCP morphology ($\Delta x$), in the direction of the grating vector. For example, in FIG. 8B the regions where the prepattern has a larger pitch form a line morphology, with a correspondingly larger pitch; whereas regions with a tight prepattern pitch form a dot morphology with a small pitch. In the limit of directing the assembly of alternating single columns of lines and dots, one may rely on the material's sensitivity to both prepattern pitch and the width of the oxide stripes to program the location of each (FIG. 8D). More complex, non-uniform areas of dots and lines can be programmed through suitable prepattern design such as an ordered single column of dots in an otherwise uniform line grating (FIG. 8E) or the inverse pattern consisting of a single line in a field of ordered dots (FIG. 8F) or even more arbitrary geometries. Thus, selective directed self-assembly affords an additional means of controlling the ordering BCP layer: by locally selecting the morphology, in addition to the spatial registry and alignment afforded by patterning DSA approaches. This enables the resist to form structures at a length scale below the chemical prepattern: for example, the radius of curvature of the dot patterns is encoded in the BCP molecules, and not the directing template.

Methods

Silicon chips (~1 $cm^2$) were cleaned in $O_2$ plasma and then coated with a hydroxyl-terminated polystyrene brush (MW=11 kg $mol^{-1}$) (Polymer Source, Inc.) by spin-casting from toluene (1% wt) and annealing at 200° C. for 4 hours in a vacuum oven. Unattached PS was removed after annealing by rinsing with toluene. The advancing contact angle of the prepared PS brush was measured at 94±6° and a receding contact angle of 77±5°. PMMA electron-beam resist was spin-coated to a thickness of ~50 nm and baked on a hot plate at 180° C. for 3 min. Line/space grating patterns were exposed in a JEOL JBX6300-FS electron beam lithography tool using 1 nA beam current with doses ranging from 1,200 to 2,080 μC $cm^{-2}$. After exposure, the samples were developed in room temperature methyl isobutyl ketone:isopropyl alcohol (IPA)(1:3) for 60 s and rinsed in isopropyl alcohol.

Exposed grating patterns were transferred to the PS brush by oxygen plasma etching (March Plasma CS1701) RIE tool using 82 mTorr $O_2$, 14 W radiofrequency power for ~30 s. The remaining PMMA was removed by soaking in toluene at 60° C. for 10 min, with the final 5 min in an ultrasonic bath. Block copolymer solutions (Polymer Source, Inc.) consisted of lamellar-forming material (MW=104 kg $mol^{-1}$, polydispersity 1.09, 50.1% PS content) and cylinder-forming material (MW=99 kg $mol^{-1}$, polydispersity 1.09, 63.8% PS), at 1% concentration in toluene. Gel permeation chromatography (GPC) and nuclear magnetic resonance (NMR) were performed to confirm material purity. BCP films were deposited by spin-coating at 2,000 r.p.m. for 45 s. The films were thermally annealed in a vacuum oven at 205° C. for ~12 h.

To increase the contrast during SEM imaging, after anneal, samples were illuminated with ultraviolet light for 5 min and developed in acetic acid to remove the PMMA block. Images of uncoated samples were taken with an Hitachi S-4800 scanning electron microscope with an accelerating voltage at 1 kV in deceleration mode. Data for FIGS. 6A-6C were obtained from a single chip simultaneously patterned with a range of grating pitch and exposure dose. About 10 samples have been imaged with similar results.

The description has not attempted to exhaustively enumerate all possible variations. The alternate embodiments may not have been presented for a specific portion of the invention, and may result from a different combination of described portions, or that other undescribed alternate embodiments may be available for a portion, is not to be considered a disclaimer of those alternate embodiments. It will be appreciated that many of those undescribed embodiments are within the literal scope of the following claims, and others are equivalent. Furthermore, all references, publications, U.S. Patents, and U.S. Patent Application Publications cited throughout this specification are incorporated by reference as if fully set forth in this specification.

The invention claimed is:

1. A method for creating patterns on a surface of a substrate, comprising depositing a polymer brush onto the surface of the substrate;
   depositing a resist layer;
   forming grating patterns onto the resists;
   developing the grating patterns;
   etching to transfer the grating pattern to the polymer brush;
   depositing a block copolymer film onto to the substrate; and
   forming a pattern on the surface of the substrate, said pattern comprising multiple morphologies on a single patterning layer.

2. The method of claim 1, wherein the block copolymer film comprises PS-PMMA (polystyrene-poly(methylmethacrylate)), PS-P2VP (polystyrene-b-2-vinylpyridine), PS-P4VP (polystyrene-b-4-vinylpyridine), PS-PEO (polystyrene-b-polyethylene oxide), or PS-PDMS (polystyrene-b-polydimethylsiloxane).

3. The method of claim 1, wherein the block copolymer has an average molecular weight ranging approximately from about 5 kg/mol to about 500 kg/mol.

4. The method of claim 2, wherein the block copolymer comprises more than 2 copolymers.

5. The method of claim 1, wherein forming grating patterns onto the resists is achieved by electron beam lithography photolithography, ion beam lithography, laser lithography, interference lithography, or imprint lithography.

6. The method of claim 1, further comprising:
   plasma cleaning the substrate before depositing the polymer brush.

7. The method of claim 1, further comprising:
   annealing the block copolymer film.

8. The method of claim 1, wherein the block copolymer film has a predetermined pattern.

9. The method of claim 8, wherein the predetermined pattern comprises lines.

10. The method of claim 8, wherein the predetermined pattern comprises ordered dots.

11. The method of claim 10, wherein the dots are structured into hexagonal dot arrays.

12. The method of claim 8, wherein the predetermined pattern comprises lines and ordered dots.

13. The method of claim 1, wherein the grating patterns have a pitch between about 40 nm and about 60 nm.

14. The method of claim 13, wherein the pitch is from 42 nm to 54 nm.

15. The method of claim 1, wherein the method further comprises varying a prepattern linewidth, varying a duty cycle, or varying a prepattern pitch within two regions of a prepattern.

16. The method of claim 1, wherein the multiple morphologies comprise dots and lines.

17. The method of claim 1, wherein the multiple morphologies comprise alternating dot array and line array regions.

* * * * *